United States Patent [19]

Miyamoto

[11] Patent Number: 4,747,078
[45] Date of Patent: May 24, 1988

[54] SEMICONDUCTOR MEMORY DEVICE

[75] Inventor: Hiroshi Miyamoto, Itami, Japan

[73] Assignee: Mitsubishi Denki Kabushiki Kaisha, Tokyo, Japan

[21] Appl. No.: 823,099

[22] Filed: Jan. 27, 1986

[30] Foreign Application Priority Data

Mar. 8, 1985 [JP] Japan .................................. 60-47240

[51] Int. Cl.$^4$ ............................................ G11C 11/40
[52] U.S. Cl. ...................................... 365/51; 365/149; 365/150
[58] Field of Search .......................... 365/51, 149, 150

[56] References Cited

U.S. PATENT DOCUMENTS 3,159,820 12/1964 Oden ...................................... 365/51
3,506,969 4/1970 Abbas ..................................... 365/51
4,689,770 8/1987 Miyamoto et al. .

Primary Examiner—Terrell W. Fears
Attorney, Agent, or Firm—Lowe, Price, LeBlanc, Becker & Shur

[57] ABSTRACT

A semiconductor memory device in accordance with the present invention comprises an arrangement in which distances ($d_1$, $d_2$ and $d_3$) between an aluminum lead )SBL1) connected to a drain of a FET of sense amplifier and an aluminum lead short-circuiting a memory cell plate formed outside the sense amplifier array are respectively equal to distances ($d_1$, $d_2$ and $d_3$) between adjacent aluminum leads (SBL2 and SBL3). For the purpose of forming the above described arrangement, the shape of the lateral edge of the aluminum lead (3) facing the sense amplifier array is made the same as the shape of the lateral edge of the aluminum lead (SBL2) connected to a bit line. Thus, the capacity associated with the lead of the outermost sense amplifier in the sense amplifier array can be made almost equal to the capacity included in each lead in the sense amplifier array and at the time of reading the content stored in the capacity of the memory cell connected to the outermost bit line in the memory cell array, occurrence of an error in reading can be prevented.

4 Claims, 5 Drawing Sheets

SEMICONDUCTOR MEMORY DEVICE

BACKGROUND OF THE INVENTION

1. Field of the Invention

The present invention relates to a semiconductor memory device. More particularly, the present invention relates to a semiconductor memory device comprising a large-scale integrated circuit such as a dynamic random access memory (hereinafter referred to as a dynamic RAM).

2. Description of the Prior Art

FIG. 1 shows an arrangement of a conventional dynamic RAM and FIG. 2 shows an arrangement of a sense amplifier portion included in a conventional dynamic RAM.

First, referring to FIG. 1 a typical arrangement of a conventional dynamic RAM will be described. In FIG. 1, a memory cell array MCA comprises word lines WL, bit lines BL and a sense amplifier array SAA. Although a plurality of word lines WL and bit lines BL are provided in a memory cell array MCA according to the memory capacity, only one word line and one bit line are shown in FIG. 1.

Referring to FIG. 2, a sense amplifier in the end portion of the sense amplifier array SAA surrounded by a, b, c and d in FIG. 1 will be described in the following. One end of each of the aluminum leads SBL1, $\overline{SBL1}$, . . . , $\overline{SBL3}$ in the sense amplifier is connected to the associated bit line and the aluminum lead 1 short-circuits a cell plate of a memory cell not shown. The sense amplifier comprises insulated field effect transistors (hereinafter referred to as FET's), the FET's including gates G1, . . . G6 respectively. To one end of the aluminum lead 2, a sense amplifier activation signal is applied. The other ends of the aluminum leads SBL1, $\overline{SBL1}$, . . . $\overline{SBL3}$ are connected respectively to the drains of the FET's and the aluminum lead 2 is connected to the sources of the FET's. The regions surrounded by dotted lines in FIG. 2 represent activation regions for forming the sources and drains of the FET's.

In a conventional dynamic RAM, as shown in FIG. 2, the sense amplifiers are arrayed so that the distances $d_1$, $d_2$ and $d_3$ between the aluminum leads of the adjacent sense amplifiers provided repeatedly with a certain cycle are equal respectively, while the distances $d_{1a}$, $d_{2a}$ and $d_{3a}$ between the aluminum lead SBL1 of the outermost sense amplifier of the sense amplifier array SAA and the aluminum lead 1 provided further outside are different from the distances $d_1$, $d_2$ and $d_3$. In the case of FIG. 2, the distances $d_{1a}$, $d_{2a}$ and $d_{3a}$ are respectively smaller than $d_1$, $d_2$ and $d_3$.

FIG. 3 shows a state in which memory cells and sense amplifiers are connected. In FIG. 3, the bit line BL1 is connected with the drain of a FET QC1 forming a memory cell and the drain of a FET QD1 forming a dummy cell and further connected with the source of a FET QS1 forming a sense amplifier via the aluminum lead SBL1. The bit line $\overline{BL1}$ is connected with the drain of a FET QC2 forming a memory cell and the drain of a FET QD2 forming a dummy cell and further connected with the source of a FET QS2 via the aluminum lead $\overline{SBL1}$. To the respective drains of the FET's QS1 and QS2, an activation signal S is supplied. The gate of the FET QS1 is connected to the aluminum lead $\overline{SBL1}$ and the gate of the FET QS2 is connected to the aluminum lead SBL1.

The word line WL1 is connected with the gate of the FET QC1 and the source thereof is connected with a capacitor CC1 so that a memory cell is formed by the capacitor CC1 and the FET QC1. In the same manner, the word line WL2 is connected with the gate of the FET QC2 and the source of the FET QC2 is connected with a capacitor CC2 so that a memory cell is formed by the capacitor CC2 and the FET QC2. The dummy word line DWL1 is connected with the gate of the FET QD1 and the source thereof is connected with a capacitor CD1 so that a dummy cell is formed by the capacitor CD1 and the FET QD1. In the same manner, the dummy word line DWL2 is connected with the gate of the FET QD2 and the source thereof is connected with a capacitor CD2 so that a dummy cell is formed by the capacitor CD2 and the FET QD2.

To a point of connection between the source of the FET QD1 and the capacitor CD1, the drain of a FET QR1 for discharging the dummy cell is connected. To a point of connection between the FET QD2 and the capacitor CD2, the drain of a FET QR2 for discharging the dummy cell is connected. To the respective gates of the FET's QR1 and QR2, a dummy cell reset signal $\overline{RST}$ is supplied.

The aluminum leads SBL1 and $\overline{SBL1}$ may be connected electrically with floating capacities CS10 and CS20 for grounding potential and an interline capacity CS12 between the aluminum leads SBL1 and $\overline{SBL1}$. Furthermore, the aluminum lead SBL1 may be connected with an interline capacity CS11 for the outer aluminum lead 1 and the aluminum lead $\overline{SBL1}$ may be connected with an interline capacity CS23 for the adjacent aluminum lead $\overline{SBL2}$.

The aluminum leads in the sense amplifiers are disposed so that each capacity associated therewith is almost equal to the sum of a floating capacity and an interline capacity. However, as shown in FIG. 2, the distance between the outermost aluminum lead SBL1 of the sense amplifier array SAA and the aluminum lead 1 existing further outside is smaller than the distance between other aluminum leads and accordingly, the capacity associated with the aluminum lead SBL1 is larger than the capacity associated with other aluminum leads.

Therefore, in order to dissolve the inequality of the capacities associated with the bit lines, a method may be considered in which the distance between an aluminum lead extending from the aluminum lead 1 to be disposed outside the bit line BL1 and the bit line BL1 is made equal to the distance between the bit line BL1 and the bit line BL2. However, even in this method, the capacity connected to the bit line BL1 and the capacity connected to the bit line $\overline{BL1}$ would be different in the end because the capacity associated with the aluminum lead SBL1 and the capacity associated with the aluminum lead $\overline{SBL1}$ are different as described above and in the example shown in FIG. 2, the capacity associated with the bit line BL1 (hereinafter referred to as CBL1) is larger than the capacity associated with the bit line $\overline{BL1}$ (hereinafter referred to as $\overline{CBL1}$).

FIGS. 4A and 4B are waveform diagrams showing a part of operation of a conventional dynamic RAM. Referring to FIGS. 4A and 4B, the operation of a dynamic RAM comprising bit lines, aluminum leads connected to the bit lines and an outer aluminum lead as described above will be described in the following, with regard to a case of reading the content stored in the capacitor CC1 of the memory cell shown in FIG. 3.

Let us first assume that the content stored in the capacitor CC1 is "1". First, the dummy cell reset signal RST rises to "H" and the FET's QR1 and QR2 are conducted so that the capacitors CD1 and CD2 are discharged. The bit lines BL1 and $\overline{BL1}$ are precharged at the level "H" by precharge means not shown.

Then, after the dummy cell reset signal RST falls to the level "L", the word line WL1 and the dummy word line DWL2 are brought to the level "H" at the time $t_0$. In consequence, the FET's QC1 and QD2 are turned on so that the bit line $\overline{BL1}$ and the aluminum lead SBL1 are connected with the capacitor CC1 and the bit line BL1 and the aluminum lead SBL1 are connected with the capacitor CD2. As a result, the electric charge stored in the floating capacity CS10, the interline capacities CS11 and CS12 associated with the aluminum lead $\overline{SBL1}$ and the electric charge stored in the capacitor CC1 are averaged. At the same time, the electric charge stored in the floating capacity CS20, the interline capacities CS23 and CS12 associated with the aluminum lead $\overline{SBL1}$ and the electric charge stored in the capacitor CD2 are averaged.

At this time, the capacities associated with the bit lines BL1 and $\overline{BL1}$ excluding the portions of the aluminum leads SBL1 and $\overline{SBL1}$ are made almost equal and therefore, these capacities will not be particularly considered in this specification.

Generally, the capacity of the capacitor CC1 of the memory cell is made larger than that of the capacitor CD2 of the dummy cell and since the content stored in the capacitor CC1 of the memory cell is "1" and the capacitor CD2 of the dummy cell is discharged to be in a state corresponding to "0", the potential of the bit line BL1 is higher than the potential of the bit line $\overline{BL1}$. At this time, the total capacity $\overline{CBL1}$ associated with the bit line $\overline{BL1}$ is larger than the total capacity CBL1 associated with the bit line BL1 as described above and as a result, the potential of the bit line BL1 precharged at the level "H" is hardly changed.

When the sense amplifier activation signal S falls to "L" to activate the sense amplifier, the FET QS2 is conducted and the FET QS1 is brought into a non conductive state since the gate potential of the bit line BL1, namely, the FET QS2 is higher than the gate potential of the bit line $\overline{BL1}$, namely, the FET QS1, and as shown in FIG. 4A, the potential of the bit line BL1 is further lowered. As a result, the content "1" stored in the capacitor CC1 of the memory cell is correctly read out in the bit line BL1.

Now, the reading operation in the case of the content stored in the capacitor CC1 of the memory cell being "0" will be described. In this case, in the same manner as described above, the capacitors CD1 and CD2 of the dummy cell are discharged, the bit lines BL1 and $\overline{BL1}$ are precharged and the word line WL1 and dummy word line $\overline{DWL2}$ respectively rise to "H".

When the bit line BL1 and the aluminum lead SBL1 are connected with the capacitor CC1 and the bit line $\overline{BL1}$ and the aluminum lead $\overline{SBL1}$ are connected with the capacitor CD2, the potential of the bit line BL1 and the potential of the bit line $\overline{BL1}$ are both lowered since the content stored in the capacitor CC1 is "0" and the capacitor CD2 is discharged to be also in a state corresponding to "0". At this time, the capacity $\overline{CBL1}$ associated with the bit line $\overline{BL1}$ and the capacity CBL1 associated with the bit line $\overline{BL1}$ are in a relation of CBL1 > $\overline{CBL1}$ as described above although the capacity of the capacitor CC1 is larger than the capacity of the capacitor CD2. If there is a large difference between the capacities CBL1 and $\overline{CBL1}$, the potential of the bit line $\underline{BL1}$ becomes higher than the potential of the bit line BL1 as shown in FIG. 4B. Accordingly, the FET QS2 is conducted and the FET QS1 is turned off and in consequence, the potential of the bit line BL1 does not correspond to the dotted line shown in FIG. 4B and on the contrary, the potential of the bit line BL1 is further lowered, which causes "1" to be read out in the bit line BL1. Thus, an error in reading occurs.

Since a conventional dynamic RAM is thus constructed, a difference in the capacities associated with the bit lines cannot be avoided to case an error in reading because the spacing between the aluminum lead SBL1 of the outermost sense amplifier in the sense amplifier array SAA and the aluminum lead 3 provided further outside is different from the spacing between the adjacent aluminum leads in the sense amplifier array SAA even if the bit lines the aluminum leads in the sense amplifier array SAA are arranged symmetrically.

Particularly in case where the distance between the aluminum lead of the outermost sense amplifier in the sense amplifier array SAA and the aluminum lead provided further outside is smaller than the distance between the respective adjacent aluminum leads in the sense amplifier array SAA, an error in reading is liable to occur when "0" is stored in the capacitor of the memory cell connected to the outermost bit line in the memory cell array. On the contrary, in case where the former distance is larger than the latter distance, an error in reading is liable to occur when "1" is stored in the capacitor of the memory cell connected to the outermost bit line in the memory cell array. Furthermore, if the degree of integration of semiconductor memories is increased and the spacing between the aluminum leads becomes narrow, the ratio of each interline capacity to the total capacity associated with the aluminum leads is increased, but if inequality exists in the interline capacities, reading operation of the dynamic RAM cannot be correctly performed.

SUMMARY OF THE INVENTION

Therefore, a principal object of the present invention is to provide a semiconductor memory device in which occurrence of an error in reading can be prevented effectively at the time of reading the content in a memory cell connected to the outermost bit line in a memory cell array.

Briefly stated, in a semiconductor memory device in accordance with the present invention where a plurality of bit lines provided parallel to one another in a memory cell array include almost equal capacities, the capacity included in the lead of the outermost sense amplifier in the sense amplifier array is almost equal to the capacity included in each of the leads connected to the bit lines in the sense amplifier array.

Consequently, in the present invention, the capacities associated with the respective bit lines are made more uniform as the result of making almost equal the capacities included in the respective leads as compared with a convention device where only the capacities associated with the bit lines are made uniform. Thus, at the time of reading the content stored in the capacitor of the memory cell connected to the outermost bit line in the memory cell array, occurrence of an error in reading can be more effectively prevented.

In a preferred embodiment of the present invention, a first lead formed outside a sense amplifier array and leads connected to the respective bit lines are of the same material and the shape of the lateral edge of the first lead facing the sense amplifier array is the same as the shape of the lateral edge of the lead connected to each bit line, the distances between the first lead and the outermost lead out of the leads connected to the bit lines in the sense amplifier array being made equal to the distances between the corresponding portions of the respective leads connected to the bit lines in the sense amplifier array. As a result, the capacity associated with the lead of the outermost sense amplifier in the sense amplifier array can be made almost equal to the capacity associated with each of the other leads in the sense amplifier array.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
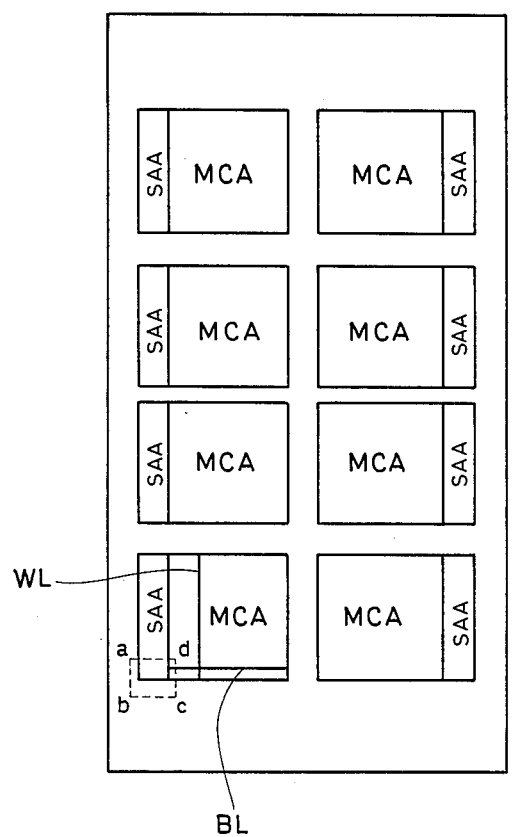
FIG. 1 shows an arrangement of a conventional dynamic RAM.
Figure 2:
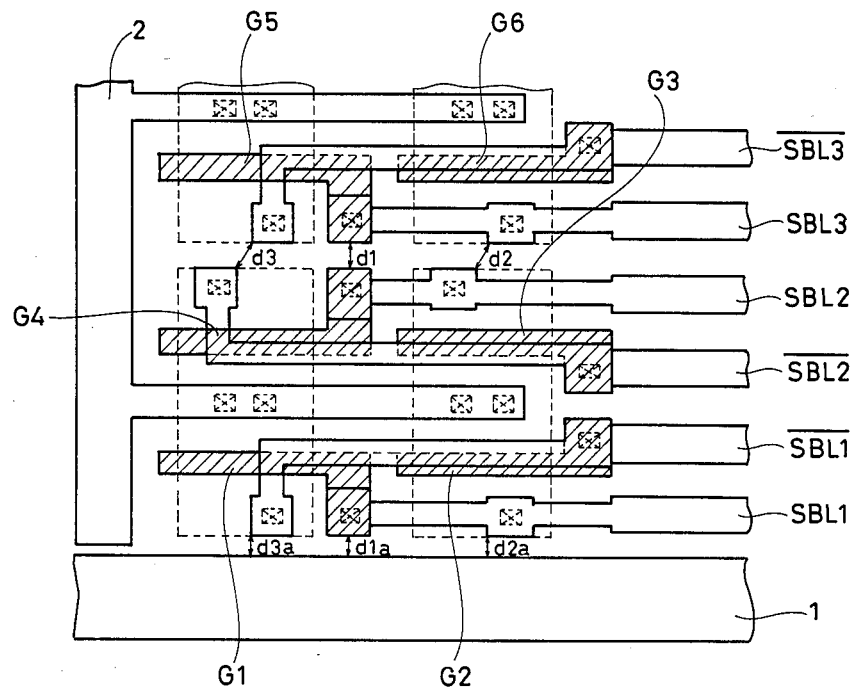
FIG. 2 shows an arrangement of a sense amplifier portion in a conventional dynamic RAM.
Figure 5:
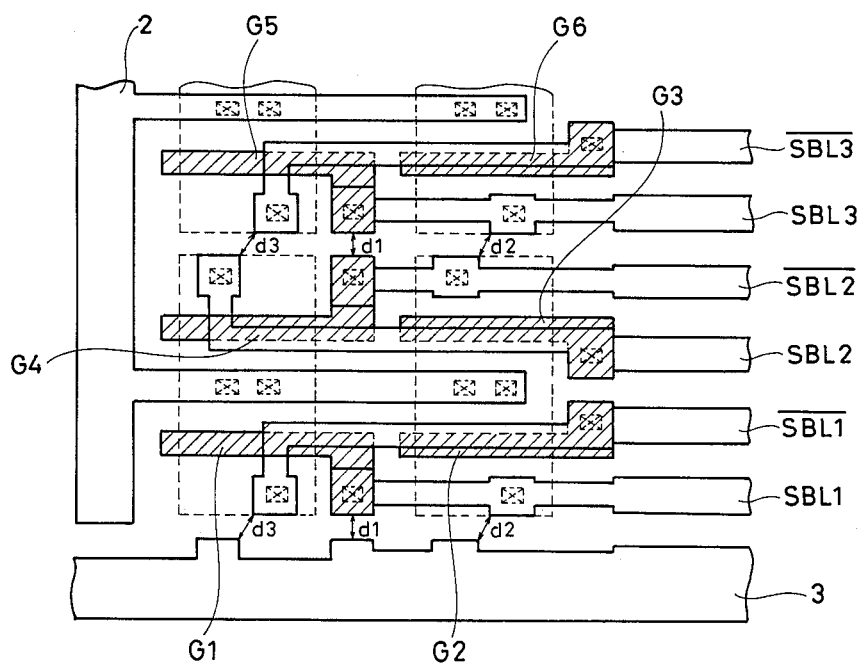
FIG. 5 is a plane view showing a semiconductor memory device of an embodiment of the present invention.
Figure 3:
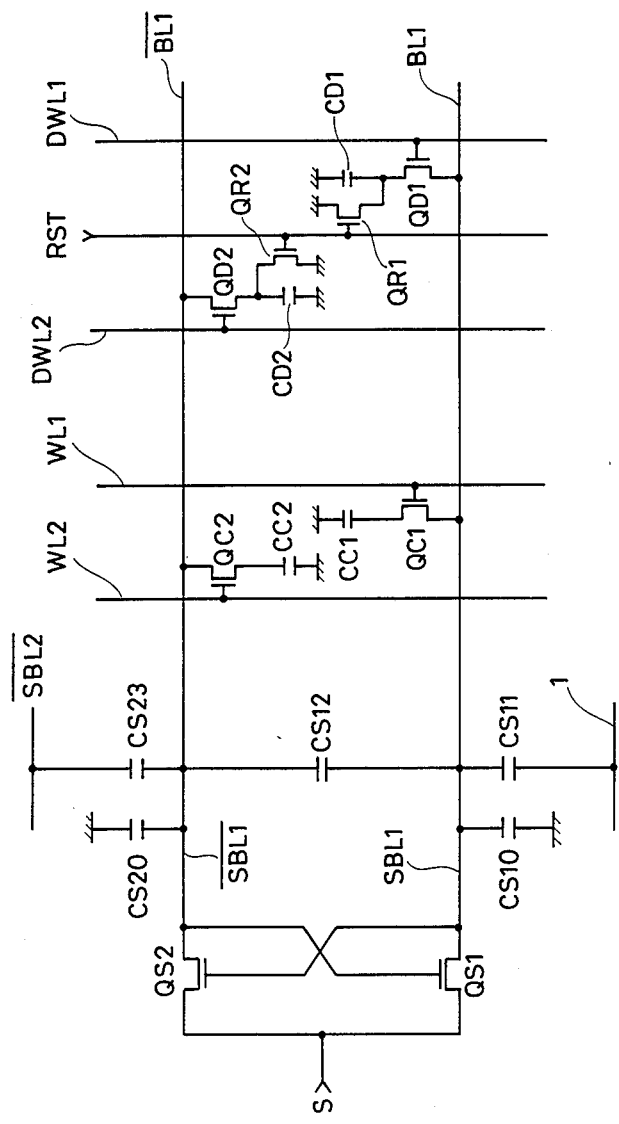
FIG. 3 shows a state in which memory cells and sense amplifiers are connected.
Figure 4A:
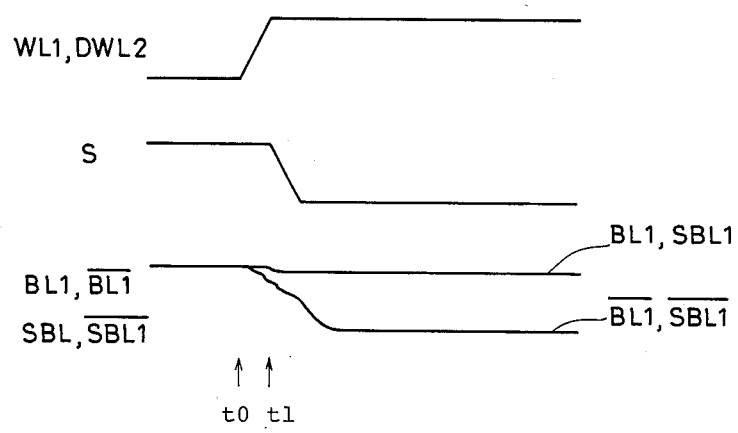
FIGS. 4A and 4B are waveform diagrams showing a part of operation of a conventional dynamic RAM.
Figure 4B:
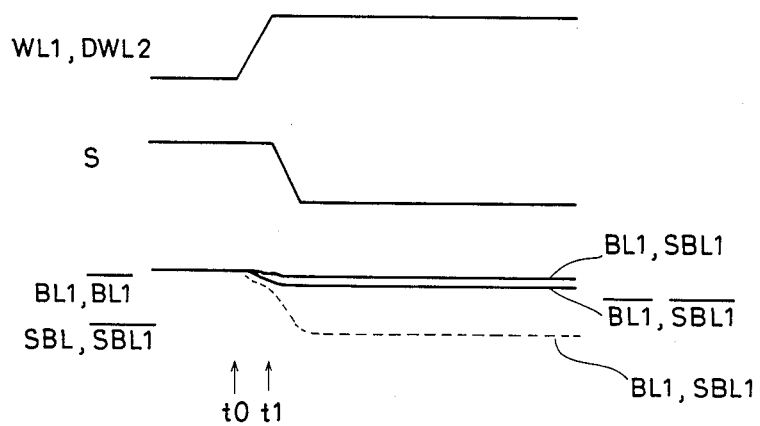

FIG. 5 is a plane view of an embodiment of the present invention. The dynamic RAM shown in FIG. 5 is the same as the above described dynamic RAM shown in FIG. 2 except for the below described points. In the dynamic RAM shown in FIG. 5, sense amplifier are arrayed so that the distances $d_1$, $d_2$ and $d_3$ between the aluminum leads of the adjacent sense amplifiers provided cyclically are respectively equal. In addition, the distances between the aluminum lead SBL1 of the outermost sense amplifier of the sense amplifier array SAA and the aluminum lead 3 provided further outside are equal to the distances $d_1$, $d_2$ and $d_3$. More specifically, the shape of the lateral edge of the aluminum lead 3 facing the sense amplifier array SAA is the same as the shape or the lateral edge of each of the aluminum leads SBL2 and $\overline{SBL2}$ connected to bit lines, facing the aluminum leads SBL3 and $\overline{SBL3}$. Thus, as a result of connection of the bit lines with the sense amplifiers as shown in FIG. 3, the capacity associated with the aluminum lead SBL1 and the capacity associated with the aluminum lead $\overline{SBL1}$ in the sense amplifier array are almost equal and accordingly, the total capacity $\overline{CBL1}$ associated with the bit line $\overline{BL1}$ and the total capacity CBL1 associated with the bit line BL1 are almost equal.

Figure 6A:
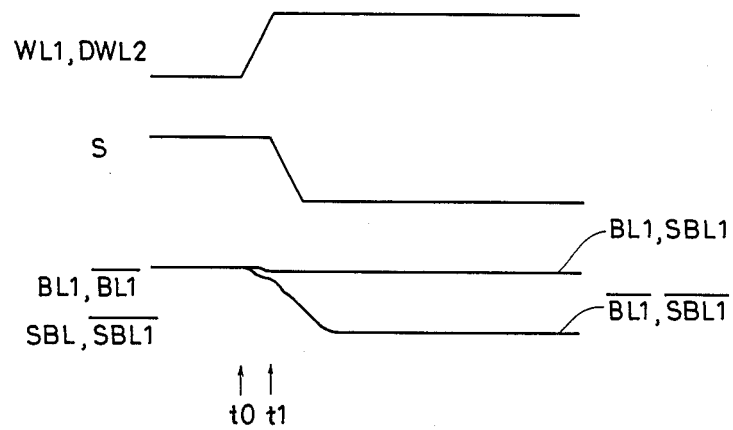
FIGS. 6A and 6B are waveform diagrams showing a part of operation in an embodiment of the present invention.
Figure 6B:
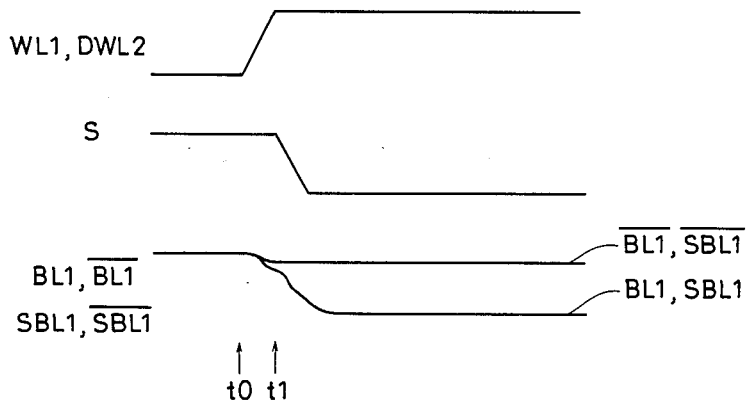

FIGS. 6A and 6B are waveform diagrams showing a part of operation in an embodiment of the present invention. Now, referring to FIGS. 5, 6A and 6B, operation for reading the content stored in the capacitor CC1 of a memory cell in a dynamic RAM of this embodiment of the invention will be described.

First, it is assumed that the content stored in the capacitor CC1 is "1". The dummy cell reset signal RST first rises to "H" and accordingly the FET's QR1 and QR2 are conducted and the capacitors CD1 and CD2 are discharged. The bit lines BL1 and $\overline{BL1}$ are precharged at the level "H" by precharge means not shown.

Then, after the dummy cell reset signal RST falls to "L", the word line WL1 and the dummy word line $\overline{DWL2}$ attain the level "H" at the time $t_0$. As a result, the FET's QC1 and QD2 are conducted and the bit line BL1 and the aluminum lead SBL1 are connected with the capacitor CC1. Further, the bit line $\overline{BL1}$ and the aluminum lead $\overline{SBL1}$ are connected with the capacitor CD2. As a result of the above described operation, the electric charge stored in the floating capacity CS10, and interline capacities CS11 and CS12 associated with the aluminum lead SBL1 and the electric charge stored in the capacitor CC1 are averaged. At the same time, the electric charge stored in the floating capacity CS20 associated with the aluminum lead SBL1 and the interline capacities CS23 and CS12 and the electric charge stored in the capacitor CD2 are averaged. The capacities associated with the bit lines BL1 and $\overline{BL1}$ excluding the aluminum leads SBL1 and $\overline{SBL1}$ are already made almost equal and therefore, they will not be particularly considered in this specification.

The capacity of the capacitor CC1 of the memory cell is generally made larger than the capacity of the capacitor CD2 of the dummy cell and as a result, when the content stored in the capacitor CC1 of the memory cell is "1" and the capacitor CD2 of the dummy cell is discharged to be in the state corresponding to "0", the potential of the bit line BL1 is higher than the potential of the bit line $\overline{BL1}$.

At the time $t_1$, the sense amplifier activation signal S is brought to "L" so that the sense amplifier is activated. At this time, since the potential of the bit line $\overline{BL1}$, that is, the gate potential of the FET QS2 is higher than the potential of the bit line $\overline{BL1}$, that is, the gate potential of the FET QS1 as described above, the FET QS2 is turned on and the FET QS1 is turned off. Thus, as shown in FIG. 6A, the potential of the bit line $\overline{BL1}$ is further lowered whereby the content "1" stored in the capacitor CC1 of the memory cell can be correctly read out in the bit line BL1.

Now, in the following, reading operation in the case of the content stored in the capacitor CC1 of the memory cell being "0" will be described. In this case, the operations for discharging the capacitors of the dummy cells, precharging the bit lines and bringing the word lines and the dummy word lines to "H" are the same as described above. When the bit line BL1 and the aluminum lead SBL1 are connected with the capacitor CC1 and the bit line $\overline{BL1}$ and the aluminum lead $\overline{SBL1}$ are connected with the capacitor CD2, the potential of the bit line BL1 and that of the bit line $\overline{BL1}$ are both lowered since the content stored in the capacitor CC1 is "0" and the capacitor CD2 is also in the state similar to "0" by discharging.

At this time, since the capacity of the capacitor CC1 is larger than the capacity of the capacitor CD2 and the capacities associated with the bit lines BL1 and $\overline{BL1}$ are almost equal, the potential of the bit line BL1 is made lower than the potential of the bit line $\overline{BL1}$ without fail. Accordingly, as shown in FIG. 6B, as the potential of the bit line $\overline{BL1}$ is lower than the potential of the bit line BL1, the content "0" stored in the capacitor CC1 of the memory cell is correctly read out in the bit line BL1.

Although in the above described embodiment, the bit lines, the leads in the sense amplifier arrays and the outside lead were formed of aluminum, they may be formed of other materials to obtain the same effect as in the above described embodiment.

In addition, although in the above described embodiment, the material of the bit lines and the leads in the sense amplifier array and the material of the outside lead were the same, the outside leads may by formed of a material different from the material of the bit lines and the leads in the sense amplifier array by suitably selecting the position and the shape of the lateral edge of the outside lead.

In addition, although in the above described embodiment, N channel FET's were used as the FET's, P channel FET's or complementary MIS FET's or bipolar transistors may be used. In such cases, the same effect as in the above described embodiment can be obtained.

Furthermore, although an example of a dynamic RAM was taken in the above described embodiment, other memories such as a static RAM may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory, comprising: a plurality of field effect transistors, said field effect transistors comprising memory cells of a memory cell array; a plurality of bit lines substantially parallel to one another, capacitances between said plurality of bit lines approximately equal; a sense amplifier array comprising a plurality of sense amplifiers connected to said memory cell array said DRAM further comprising:
   means for substantially equalizing the capacitance associated with an outermost sense amplifier lead in said sense amplifier array and the capacitances associated with remaining leads in the sense amplifier array.

2. A DRAM in accordance with claim 1, wherein said means for substantially equalizing said capacitance is a first lead formed externally to said sense amplifier array; said first lead being formed of the same material as that of the leads connected to said bit lines; the lateral edge of said first lead facing said sense amplifier array shaped the same as the lateral edge of said leads connected to said bit lines; the distance between said first lead and an outermost lead connected to said bit lines in said sense amplifier array being substantially equal to the distance between said leads connected to said bit lines in said sense amplifier array.

3. A DRAM in accordance with claim 1, wherein said first lead and said leads connected to said bit lines are made of aluminum.

4. A dynamic random access memory (DRAM) comprising:
   a plurality of memory cells forming a memory cell array;
   said memory cells comprising field effect transistors;
   said memory cells connected to a plurality of bit lines, said bit lines substantially parallel to each other with approximately equal capacitances between said bit lines;
   a plurality of sense amplifiers forming a sense amplifier array connected by first leads to said bit lines;
   said first leads formed externally to said sense amplifier array and made of the same material as that of said bit lines; and
   the lateral edges of said first leads shaped the same as the lateral edge of said bit lines, substantially equalizing the capacitances associated with said first leads and said bit lines.

* * * * *

REEXAMINATION CERTIFICATE (1121st)

United States Patent [19]

Miyamoto

[11] B1 4,747,078

[45] Certificate Issued Sep. 5, 1989

[54] SEMICONDUCTOR MEMORY DEVICE

[75] Inventor: Hiroshi Miyamoto, Itami, Japan

[73] Assignee: Mitsubishi Denki Kabushiki Kaisha, Tokyo, Japan

Reexamination Request:
No. 90/001,536, Jun. 15, 1988

Reexamination Certificate for:
Patent No.: 4,747,078
Issued: May 24, 1988
Appl. No.: 823,099
Filed: Jan. 27, 1986

[30] Foreign Application Priority Data

Mar. 8, 1985 [JP] Japan .................................. 60-47240

[51] Int. Cl.⁴ .................................................. G11C 11/40
[52] U.S. Cl. ........................................ 365/051; 365/149; 365/150
[58] Field of Search ............................ 365/51, 149, 150

[56] References Cited

U.S. PATENT DOCUMENTS 4,551,820  11/1985  Matsuura .
4,678,770  8/1987   Miyamoto et al. .

*Primary Examiner*—Terrell W. Fears

[57] ABSTRACT

A semiconductor memory device in accordance with the present invention comprises an arrangement in which distances ($d_1$, $d_2$ and $d_3$) between an aluminum lead)SBL1) connected to a drain of a FET of sense amplifier and an aluminum lead short-circuiting a memory cell plate formed outside the sense amplifier array are respectively equal to distances ($d_1$, $d_2$ and $d_3$) between adjacent aluminum leads (SBL2 and SBL3). For the purpose of forming the above described arrangement, the shape of the lateral edge of the aluminum lead (3) facing the sense amplifier array is made the same as the shape of the lateral edge of the aluminum lead (SBL2) connected to a bit line. Thus, the capacity associated with the lead of the outermost sense amplifier in the sense amplifier array can be made almost equal to the capacity included in each lead in the sense amplifier array and at the time of reading the content stored in the capacity of the memory cell connected to the outermost bit line in the memory cell array, occurrence of an error in reading can be prevented.

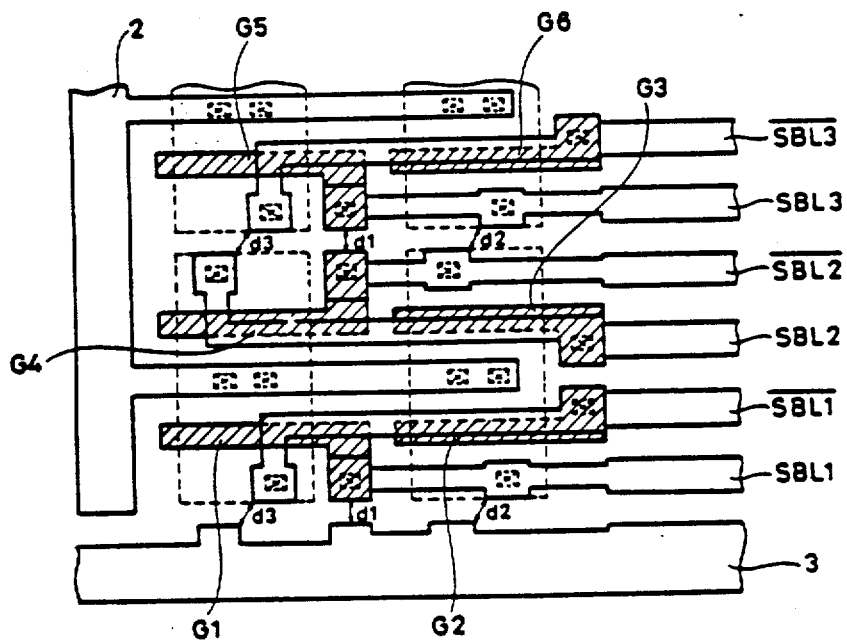

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 2 is cancelled.

Claims 1, 3 and 4 are determined to be patentable as amended.

New claim 5 is added and determined to be patentable.

1. A dynamic random access memory, comprising:
a plurality of field effect transistors, said field effect transistors comprising memory cells of a memory cell array; a plurality of bit lines substantially parallel to one another, capacitances between said plurality of bit lines approximately equal; a sense amplifier array comprising a plurality of sense amplifiers connected to said memory cell array said DRAM further comprising:
means for substantially equalizing the capacitance associated with an outermost sense amplifier lead in said sense amplifier array and the capacitances associated with remaining leads in the sense amplifier array, *including the lateral edges of said outermost sense amplifier lead facing said sense amplifier array being shaped the same as the lateral edge of said leads connected to said bit lines and so spaced from an outermost lead connected to said bit lines as to substantially equalize said capacitance.*

3. A DRAM in accordance with claim [1] *5*, wherein said first lead and said leads connected to said bit lines are made of aluminum.

4. A dynamic random access memory (DRAM) comprising:
a plurality of memory cells forming a memory cell array;
said memory cells comprising field effect transistors;
said memory cells connected to a plurality of bit lines, said bit lines substantially parallel to each other with approximately equal capacitances between said bit lines;
a plurality of sense amplifiers forming a sense amplifier array connected by first leads to said bit lines;
said first leads formed externally to said sense amplifier array and made of the same material as that of said bit lines; and
the lateral edges of said first leads shaped the same as the lateral edge of said bit lines [,] *and spaced from the outermost said bit line at such a distance as to substantially* [equalizing] *equalize* the capacitances associated with said first leads and said bit lines.

*5. A dynamic random access memory, comprising:
a plurality of field effect transistors, said field effect transistors comprising memory cells of a memory cell array; a plurality of bit lines substantially parallel to one another, capacitances between said plurality of bit lines approximately equal; a sense amplifier array comprising a plurality of sense amplifiers connected to said memory cell array said DRAM further comprising:*

*means for substantially equalizing the capacitance associated with an outermost sense amplifier lead in said sense amplifier array and the capacitances associated with remaining leads in the sense amplifier array, wherein*

*said means for substantially equalizing said capacitance is a first lead formed externally to said sense amplifier array; said first lead being formed of the same material as that of the leads connected to said bit lines; the lateral edge of said first lead facing said sense amplifier array shaped the same as the lateral edge of said leads connected to said bit lines; the distance between said first lead and an outermost lead connected to said bit lines in said sense amplifier array being substantially equal to the distance between said leads connected to said bit lines in said sense amplifier array.*

* * * * *